United States Patent [19]

Thompson et al.

[11] Patent Number: 4,766,561
[45] Date of Patent: Aug. 23, 1988

[54] METHOD AND APPARATUS FOR IMPLEMENTING MULTIPLE FILTERS WITH SHARED COMPONENTS

[75] Inventors: Charles D. Thompson; Joseph P. Gergen, both of Austin, Tex.

[73] Assignee: Motorola, Inc., Schaumburg, Ill.

[21] Appl. No.: 878,770

[22] Filed: Jun. 26, 1986

[51] Int. Cl.$^4$ .................................................. G06F 7/38
[52] U.S. Cl. ..................................................... 364/724
[58] Field of Search ............................... 364/724, 728

[56] References Cited

U.S. PATENT DOCUMENTS

| | | | |
|---|---|---|---|
| 3,872,290 | 3/1975 | Crooke et al. | 364/724 |
| 3,937,287 | 2/1976 | Pryor et al. | 364/724 X |
| 4,354,248 | 10/1982 | Conger et al. | 364/724 |
| 4,561,065 | 12/1985 | Matsuda | 364/724 |
| 4,646,327 | 2/1987 | Kojima et al. | 364/724 X |
| 4,686,644 | 8/1987 | Renner et al. | 364/724 |

*Primary Examiner*—Gary V. Harkcom
*Assistant Examiner*—Long T. Nguyen
*Attorney, Agent, or Firm*—John A. Fisher; Jeffrey Van Myers

[57] ABSTRACT

A structure for implementing a plurality of independent filters, such as finite impulse response filters, in an efficient manner. Coefficient and data operands associated with each of the independent filters are stored in a predetermined order in a storage device and selectively coupled to an arithmetic unit for processing in a predetermined manner. Calculations for each filter are successively made and selectively stored. Although independent filters exist, processing circuitry is multiplexed and shared to substantially minimize associated control circuitry.

7 Claims, 3 Drawing Sheets

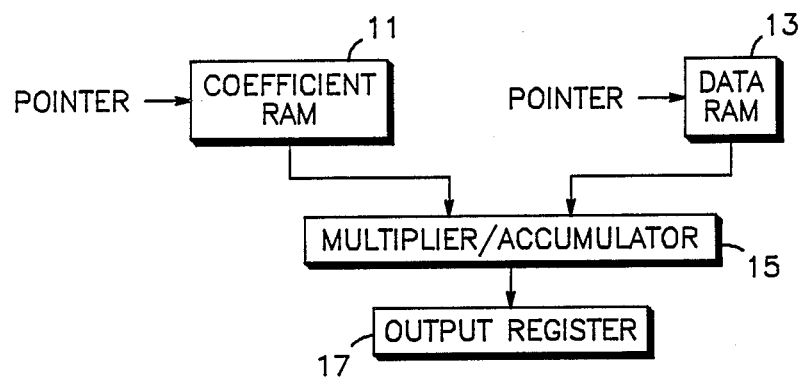
FIG. 1
—PRIOR ART—
FIG. 2
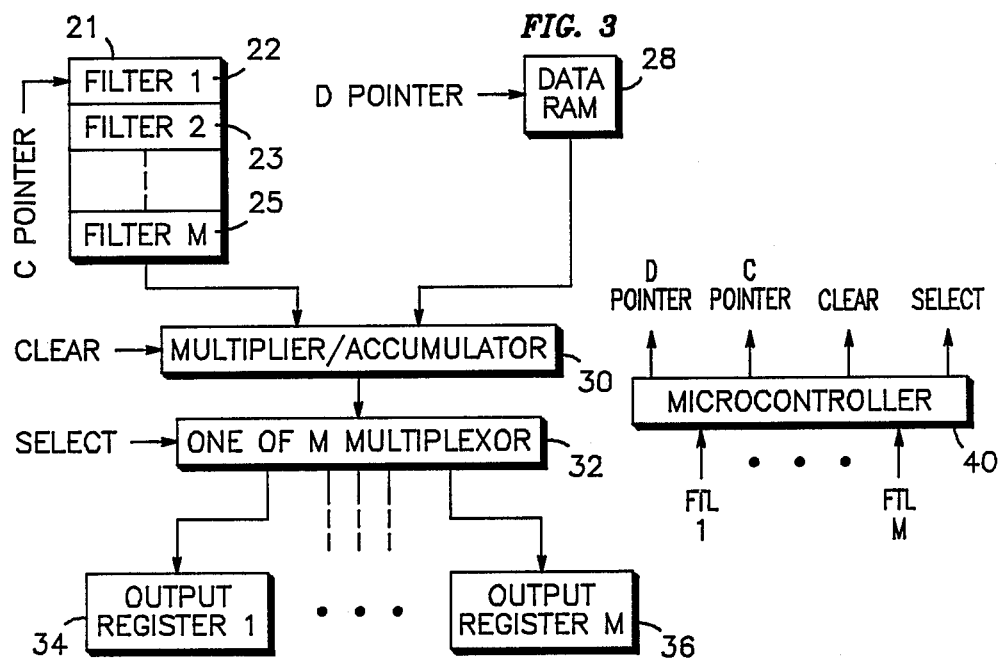
FIG. 3

METHOD AND APPARATUS FOR IMPLEMENTING MULTIPLE FILTERS WITH SHARED COMPONENTS

TECHNICAL FIELD

This invention relates generally to filter circuits, and more particularly, to multiple filter structures.

BACKGROUND ART

Signal processors typically require multiple filters to process data in numerous ways. For example, a finite impulse response (FIR) filter implements a discrete convolution between a series of input samples and predetermined coefficients. Large processing systems often need to perform a plurality of simultaneous convolutions. Previous techniques used to implement multiple filter functions have been implemented with either software or hardware or a combination of both. Others have duplicated analogous circuitry to implement a plurality of filters. In integrated circuit technology, this technique is both size and cost inefficient. In particular, control functions are increased proportionately to allow each filter to operate independently. Therefore, a plurality of sense amplifiers, address decoders, additional pointers and additional control circuitry are typically required to coordinate a multi-filtering function. As a result, the size of the associated circuitry may be prohibitive for many applications. In contrast, software implementations typically have the disadvantage of being much slower and operating less efficiently.

BRIEF DESCRIPTION OF THE INVENTION

Accordingly, an object of the present invention is to provide an improved multiple filter apparatus.

Another object of the present invention is to provide an improved method for providing multiple filters which functionally share predetermined components.

Yet another object of the present invention is to provide an improved plurality of finite impulse response filters with simplified state machine control.

In carrying out the above and other objects of the present invention, there is provided, in one form, a circuit for performing a plurality of finite impulse response filtering functions. The circuit comprises a plurality of filters in which each filter implements a predetermined digital filter algorithm. A storage circuit stores coefficient and data operands utilized in implementing the predetermined algorithm. In a preferred form, first and second storage devices are used. The first storage device stores a predetermined quantity of coefficient operands associated with each of the plurality of filters. The second storage device comprises a single circular queue for sequentially storing time sampled data operands associated with each of the plurality of filters. An arithmetic unit is coupled to the first and second storage devices, for performing a predetermined arithmetic operation with selected coefficient and data operands. A sequencing control device is provided for sequentially selecting operands from the first and second storage devices for input to the arithmetic unit.

These and other objects, features and advantages will be more clearly understood from the following detailed description taken in conjunction with the accompanying drawings.

BRIEF DESCRIPTION OF THE DRAWINGS

FIG. 1 illustrates in block diagram form a conventional single finite impulse response filter;

FIG. 2 illustrates in block diagram form a structure for implementing a plurality of filters with shared components;

DETAILED DESCRIPTION OF THE INVENTION

Figure 3:
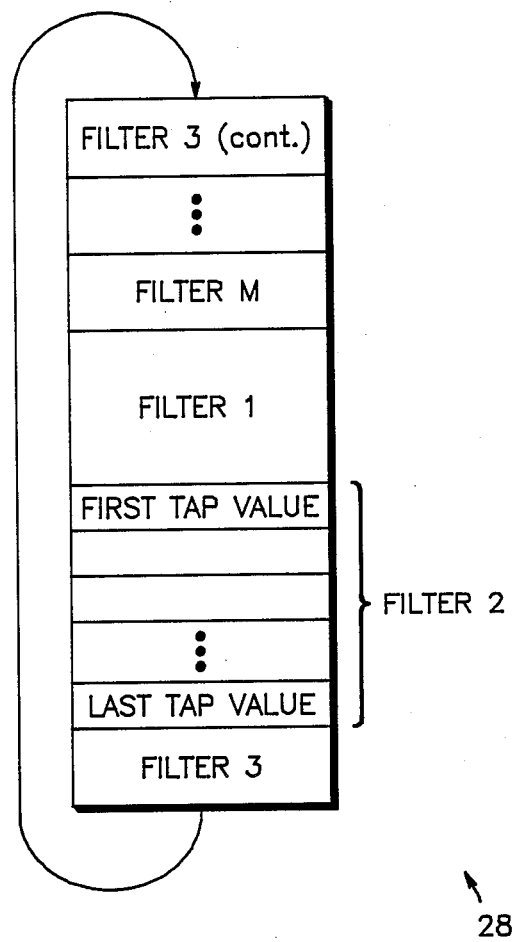
FIG. 3 illustrates in block diagram form an embodiment of the data RAM of FIG. 2.

Shown in FIG. 1 is a finite impulse response (FIR) filter known in the art for implementing the following digital filtering equation characterizing a discrete convolution:

$$y(n) = \sum_{k=0}^{N-1} i(k)x(n-k) \quad (1)$$

where $i(k)$ is a predetermined coefficient value, $x(n-k)$ is a sampled data value and $n$ and $(N-1)$ are integer values. A coefficient random access memory (RAM) 11 has a control input for receiving a pointer value and an output for providing a predetermined coefficient value in response to the pointer value. A data RAM 13 has a control input for receiving a pointer value and an output for providing a data value in response to the pointer value. The output of coefficient RAM 11 is connected to a first input of a multiplier/accumulator (MAC) 15, and the output of data RAM 13 is connected to a second input of MAC 15. An output of MAC 15 is connected to an input of an output register 17.

In operation, the filter of FIG. 1 implements a single algorithm or digital filtering equation by storing fixed predetermined coefficient values corresponding to $i(k)$ in RAM 11 and storing sampled data values $x(n-k)$ in RAM 13. In a preferred form, RAM 13 is implemented as a circular queue to simulate a shift register. In other words, data samples are controllably shifted into RAM 13. Both the queue of RAM 13 and RAM 11 output data in response to a pointer which is set by a microcontroller or microsequencer not shown. Each of RAMs 11 and 13 operates in a sequential fashion so that a data value is coupled to MAC 15 with a predetermined corresponding coefficient value. MAC 15 multiplies the received coefficient value with the received data value and typically adds the resulting product with the contents of an internal accumulator latch (not shown) to provide an accumulated product. A predetermined number of repetitive product accumulations is made in response to the external microcontroller. After a predetermined number of N multiplications, the pointer of coefficient RAM 11 and the pointer of the queue of data RAM 13 are each pointing to the first value of the next calculation associated with a new data sample. In this way, the digital filtering equation of equation (1) is implemented to perform a single predetermined filtering operation.

Shown in FIG. 2 is a multiple filter structure for implementing a plurality of independent filters, each of which functions to implement a digital filter equation such as equation (1). A plurality of M filters, where M is an integer, is provided as a partitioned coefficient RAM 21 having a partition 22 of predetermined stored coefficient values for filter 1, a partition 23 for coefficient values for filter 2, and etc. thru partition 25 for coefficient values for filter M. A "C" pointer associated with coefficient RAM 21 points to a predetermined one of the coefficients of the M filters. A data RAM 28 is provided as a single circular queue which is implemented to be large enough to hold data values associated with each of the M filters. The length of data RAM 28 equals the total number of taps of all M filters. A "D" pointer is provided for data RAM 28 for controllably outputting a predetermined data value in sequential fashion. An output of coefficient RAM 21 is connected to a first input of a multiplier/accumulator (MAC) 30. An output of data RAM 28 is connected to a second input of MAC 30. An output of MAC 30 is connected to a first input of a one of M multiplexor 32. A clear signal is coupled to a control terminal of MAC 30 for clearing the output. Multiplexor 32 provides M outputs, each of which is coupled to an input of a predetermined one of M output registers such as output registers 34 and 36. A select signal is coupled to a control terminal of multiplexor 32 for selecting one of the M outputs to couple the output of MAC 30 to. All control signals such as the pointers for RAMs 21 and 28 and the clear and select signals are provided by a conventional microcontroller 40 in response to receipt of filter tap length inputs for each of the M filters such as input FTL1 for filter one and input FTLM for filter M. The filter tap lengths are predetermined and are unique to a finite impulse response filter. Basically, the tap length or number of taps in an FIR filter is related to the accuracy of the filter and may therefore be a variable number.

In operation, MAC 30 is initially cleared and the pointers associated with coefficient RAM 21 and data RAM 28 are positioned to couple the first coefficient value and first data value associated with a first tap position of filter one substantially simultaneously to MAC 30. A product of the first coefficient and first data values provides a first output which is coupled to output register 34 by multiplexor 32 in response to the select signal. The pointers associated with filter one are now directed to second coefficient and data values which are coupled to MAC 30 substantially simultaneously. MAC 30 provides a second product of the second values and accumulates the second product with the first product to provide an accumulated output. The accumulated output is coupled to output register 34 via multiplexor 32. The select signal provided by microcontroller 40 selectively controls the routing of the outputs from MAC 30. In this manner, a plurality of predetermined coefficient values associated with filter one are multiplied with data values and added together to implement equation one above. The output value associated with filter one is stored in output register 34. After the calculation associated with filter one is complete, the C and D pointers associated with coefficient RAM 21 and data RAM 28 are pointing toward the operands of the second filter. The same operation is effected to calculate an output for the second filter and so forth thru the Mth filter. At the conclusion of operation of the calculation of the M filters, the output values associated with each filter are stored in a respective one of the M output registers. New data values may be written into data RAM 28 so that the calculations may be rapidly repeated in sequential order for the M filters.

Referring to FIG. 3, a possible structure of data RAM 28 is illustrated by way of example only. In the illustrated form, the first filter is located in the middle of the structure to illustrate that the beginning point in data RAM 28 is arbitrary. Obviously, the position of the pointers in coefficient RAM 21 and data RAM 28 are physically not pointing at the same location from the top of the queues when the filter operands do not directly structurally correlate. As shown, each filter comprises a predetermined number of individual tap position values which represent the data values. Further, data RAM 28 may be structured so that the data values for RAM 28 may wrap around in the structure without affecting the operation of the multiple filter structure of FIG. 2. What is important is that the correct sequential order of data values corresponding to the order of coefficient values in coefficient RAM 21 is present in data RAM 28.

It should be well understood that the multiple filter structure of FIG. 2 may be modified so that both data and coefficient operands are stored in the same storage device rather than in two phsyically distinct memories. Further, the filter structure of FIG. 2 may be utilized to implement many types of filters and not just a finite impulse response filter. In fact, the present embodiment which has been discussed in the context of an FIR filter may be easily adapted to include an adaptive filter. In one form of adaptive filters, the FIR filter operation is extended to include an update phase wherein the coefficients in coefficient RAM 21 are updated using the least means square (LMS) algorithm.

Figure 4:
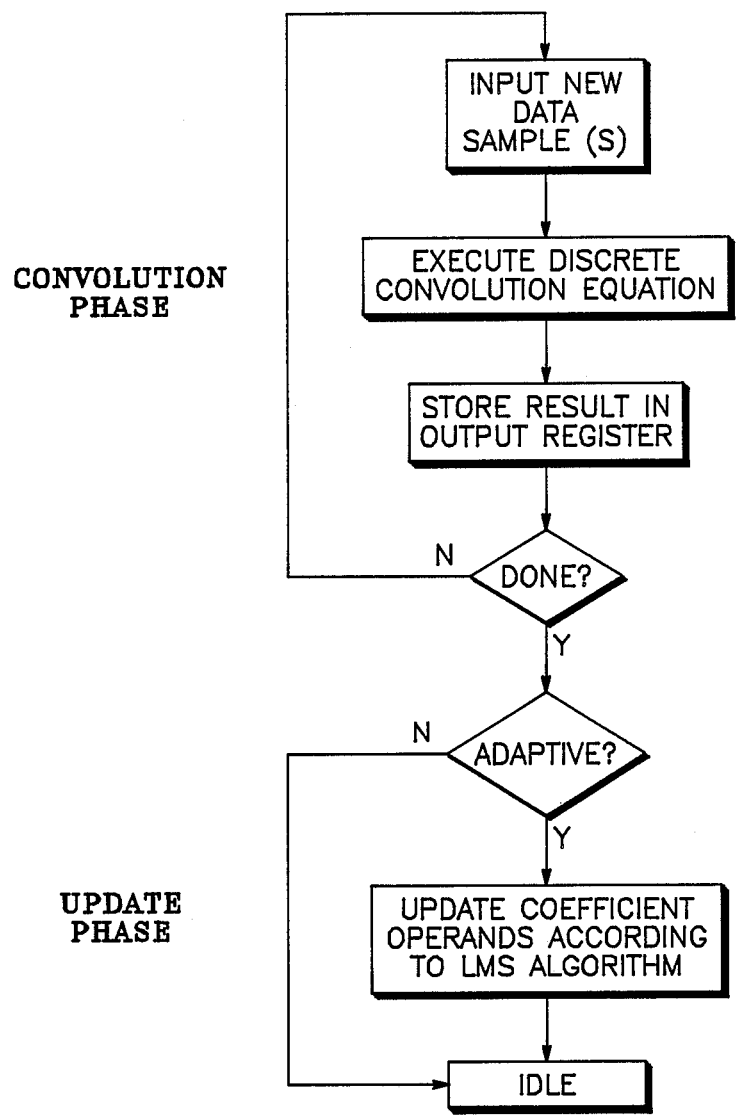
FIG. 4 illustrates in flow chart form a state machine using the multiple filter structure of FIG. 2 to implement either an FIR filter or an adaptive filter.

Shown in FIG. 4 is a flowchart of a state machine incorporating the present invention as either an FIR or an adaptive filter. As shown, the FIR filter operation is a convolution operation and includes the first four decision blocks. An adaptive filter operation is both a convolution phase and an update phase. Initially, coefficient values and data values are coupled to MAC 30. A multiplication and accumulation operation is processed for a filter as described above and the result is coupled to a predetermined output register such as output register 34. The filter calculation is completed in a similar manner for the remaining filters. A decision is made at this point in time whether or not an FIR filter operation or an adaptive filter operation is being effected. If an FIR filter operation exists, then the calculation is complete and the state machine enters into an idle state. However, if an adaptive filter operation exists, new coefficients are generated by MAC 30. Essentially, the old coefficient values from coefficient RAM 21 are coupled to MAC 30 along with predetermined data values from data RAM 28. The data values from data RAM 28 are the same as the data values previously stored for the convolution phase of operation. New coefficient values for each filter are generated by MAC 30 by adding the old coefficient value with a scaled data value. Instead of storing the new coefficient value in one of the output registers such as register 34, the new coefficient value is stored in coefficient RAM 21 and replaces an existing coefficient value. This transfer is made by an electrical path from the output of MAC 30 to coefficient RAM 21 not shown in FIG. 2. After all coefficient values have been updated in the calculation just described, the adaptive filter operation is complete and the state machine enters the idle stage.

Some of the many advantages of the multiple filter structure include the fact that a large amount of circuitry associated with coefficient RAMs and data RAMs such as sense amplifiers and address decoders has been eliminated. Since only one coefficient RAM and only one data RAM exists, the control circuitry associated with a large number of filters has been greatly reduced. It should be further appreciated that each of the M filters illustrated in FIG. 2 is independent. In other words, several filters are not being selectively multiplexed into a single filter structure but rather a single structure has been provided which contains N independent filters. Although no savings in memory storage with respect to stored coefficient and data values exists from having combined individual filters, a substantial savings in associated control circuitry for the memory storage circuitry is realized by using the structure taught herein.

While an embodiment has been disclosed using certain assumed parameters, it should be understood that certain obvious modifications to the circuit or the given parameters will become apparent to those skilled in the art, and the scope of the invention should be limited only by the scope of the claims appended hereto.

We claim:

1. A filter circuit for implementing a plurality of digital filters, each of said filters implementing a predetermined digital filter algorithm, said circuit comprising:
   storage means for storing in a sequential order groups of coefficient operands, each group of coefficient operands being used in calculations to implement a predetermined one of the digital filter algorithms and for storing in a sequential order groups of time sampled data operands, each group of data operands being used in the calculations to implement a predetermined one of the digital filter algorithms;
   an arithmetic unit coupled to the storage means, for sequentially performing predetermined arithmetic operations with selected coefficient and data operands to implement the digital filter algorithms; and
   sequencing control means coupled to the storage means and to the arithmetic unit for sequentially selecting and coupling pairs of operands from the storage means, each of said pairs comprising a coefficient operand and a data operand for input to the arithmetic unit to implement the digital filter algorithms.

2. The filter circuit of claim 1 wherein said storage means further comprise a coefficient RAM wherein the coefficient operands are stored and a data RAM for sequentially storing time sampled data operands, each of which is a tap value for a predetermined one of the filters being implemented.

3. A filter circuit for implementing a plurality of digital filters, each of said filters implementing a predetermined digital filter algorithm, said circuit comprising:
   first storage means for storing in a sequential order a predetermined quantity of coefficient operands used in arithmetic operations to implement the digital filter algorithms;
   second storage means comprising a single circular queue for sequentially storing time sampled data operands used in arithmetic operations to implement the digital filter algorithms;
   an arithmetic unit having first and second inputs coupled to the first and second storage means, respectively, for performing a predetermined arithmetic operation with selected coefficient and data operands to implement the digital filter algorithms; and
   sequencing control means coupled to the first and second storage means and to the arithmetic unit for sequentially selecting operands to be coupled from the first and second storage means for input to the arithmetic unit.

4. The filter circuit of claim 3 wherein the first storage means comprise a RAM wherein the coefficient operands are stored in a predetermined sequential order and in groups corresponding to a predetermined order of succession for implementing the filters.

5. The filter circuit of claim 3 further comprising:
   output storage means coupled to the arithmetic unit for receiving and storing results from the arithmetic unit.

6. The filter circuit of claim 5 wherein said output storage means comprises a predetermined plurality of storage registers, each of said storage registers storing an output of the arithmetic unit corresponding to a predetermined one of the plurality of filters.

7. The filter circuit of claim 6 further comprising:
   multiplexing means having an input coupled to the arithmetic unit and a plurality of outputs, each of said outputs coupled to a predetermined one of the storage registers, for selectively coupling the arithmetic unit to each storage register in response to a select signal provided by the sequencing control means.

* * * * *